(12) United States Patent
Gaucher et al.

(10) Patent No.: US 7,372,408 B2
(45) Date of Patent: May 13, 2008

(54) APPARATUS AND METHODS FOR PACKAGING INTEGRATED CIRCUIT CHIPS WITH ANTENNA MODULES PROVIDING CLOSED ELECTROMAGNETIC ENVIRONMENT FOR INTEGRATED ANTENNAS

(75) Inventors: Brian P. Gaucher, Brookfield, CT (US); Janusz Grzyb, Ossining, NY (US); Duixian Liu, Scarsdale, NY (US); Ullrich R. Pfeiffer, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 11/332,737

(22) Filed: Jan. 13, 2006

(65) Prior Publication Data
US 2007/0164907 A1    Jul. 19, 2007

(51) Int. Cl.
*H01Q 1/38* (2006.01)

(52) U.S. Cl. .................. 343/700 MS; 343/841
(58) Field of Classification Search ......... 343/700 MS, 343/841; 455/90.3
See application file for complete search history.

(56) References Cited

U.S. PATENT DOCUMENTS

| 5,898,909 | A  | * | 4/1999 | Yoshihara et al. ............ 455/73 |
| 6,087,989 | A  | * | 7/2000 | Song et al. .......... 343/700 MS |
| 6,867,746 | B2 | * | 3/2005 | Mendolia et al. ........... 343/841 |
| 6,882,319 | B2 | * | 4/2005 | Jinushi ...................... 343/702 |
| 7,095,372 | B2 | * | 8/2006 | Soler Castany et al. .... 343/700 MS |
| 7,109,925 | B2 | * | 9/2006 | Noro et al. .......... 343/700 MS |
| 7,205,899 | B2 | * | 4/2007 | Surkau .................... 340/572.8 |

* cited by examiner

*Primary Examiner*—Tan Ho
(74) *Attorney, Agent, or Firm*—F. Chau & Associates, LLC

(57) ABSTRACT

Apparatus and methods are provided for packaging IC chips together with integrated antenna modules designed to provide a closed EM (electromagnetic) environment for antenna radiators, thereby allowing antennas to be designed independent from the packaging technology.

17 Claims, 7 Drawing Sheets

APPARATUS AND METHODS FOR PACKAGING INTEGRATED CIRCUIT CHIPS WITH ANTENNA MODULES PROVIDING CLOSED ELECTROMAGNETIC ENVIRONMENT FOR INTEGRATED ANTENNAS

GOVERNMENT LICENSE RIGHTS

This invention was made with Government support under Contract No. NAS3-03070 awarded by NASA (National Aeronautics and Space Administration). The Government has certain rights in this invention.

TECHNICAL FIELD OF THE INVENTION

The present invention generally relates to apparatus and methods for packaging semiconductor IC (integrated circuit) chips with integrated antennas for millimeter wave applications and in particular, to apparatus and methods for packaging IC chips together with integrated antenna modules that are designed to provide a closed EM (electromagnetic) environment for antenna radiators, thereby allowing antennas to be designed independent from the packaging technology.

BACKGROUND

Technological innovations in wireless systems and devices have lead to widespread development of wireless network applications for wireless PAN (personal area network), wireless LAN (local area network), wireless WAN (wide area network), cellular networks, and other types of wireless communication systems. To enable wireless communication between devices in a wireless network, the devices must be equipped with receivers, transmitters, or transceivers, as well as antennas that can efficiently radiate/receive signals transmitted to/from other devices in the network.

Conventional MMW (millimeter-wave) radio communication systems are typically constructed using discrete components that are individually encapsulated and/or mounted with low integration levels on printed circuit boards, packages or substrates. For example, MMW radio communication systems are typically built using expensive and bulky wave guides and/or package-level or board-level micro strip structures that provide electrical connections between semiconductor chips (RF integrated circuits) and between semiconductor chips and transmitter or receiver antennas.

There is an increasing market demand, however, for more compact radio communication systems with integrated transmitter/receiver/transceiver and antenna systems, which provide high-performance, high data transmission rate, high-volume, low-power consumption, low cost, and low weight solutions. Indeed, current communication systems require high performance antenna systems that provide wide bandwidth and high-efficiency operating characteristics. As the operating frequency increases, the manufacture and assembly of conventional waveguide front-ends become more difficult due to high-precision machining and accurate alignment. In this regard, innovations in semiconductor fabrication and packaging technologies, coupled with requirements for higher operating frequencies, have made it practically feasible for integrating antennas with RF integrated circuits to provide highly integrated radio communication systems.

With increased integration, however, the ability to achieve high performance systems becomes more problematic, especially at millimeter wave frequencies wherein the structure and EM (electromagnetic) characteristics of the integrated antenna system and package layout will determine the achievable performance of the system. Indeed, with high-integration designs where integrated antennas are packaged in compact chip packages, the antenna performance will depend on the antenna structure as well as package structures, components and materials that are disposed in proximity to the antenna, which can significantly affect antenna performance. This is particularly true of package encapsulants (or package covers) that are used to protect the circuit and the antenna from the environment. Further, the characteristics of antenna feed lines that interface active circuitry with the antennas can vary with the package environment and, thus, affect the antenna performance (e.g., impedance mismatch).

In this regard, conventional methods for designing integrated antennas must take into consideration the package structure, layout and materials so as to obtain a desired integration level and system performance. Conventional antenna design methods do not allow integrated antennas to be designed independently of the package. Indeed, with conventional integrated antenna design techniques, an antenna designed for one type of packaging technology may not be applicable for another packaging technology, thereby requiring redesign of the antenna.

SUMMARY OF THE INVENTION

In general, exemplary embodiments of the invention include apparatus and methods for packaging semiconductor IC (integrated circuit) chips with integrated antennas to construct compact, high-performance radio/wireless communications systems for millimeter wave applications (e.g., voice communication, data communication and radar applications, etc.). More specifically, exemplary embodiments of the invention include apparatus and methods for packaging IC chips together with integrated antenna modules that are designed to provide a closed EM (electromagnetic) environment for antenna radiators, thereby allowing antennas to be designed independent from the packaging technology.

In one exemplary embodiment of the invention, an antenna module includes an integrated antenna mounted to an antenna socket. The integrated antenna device is a planar antenna substrate having a printed antenna formed on a surface thereof. The integrated antenna is mounted to an antenna socket structure that is designed to shield antenna radiator elements from packaging materials and components and provide a closed electromagnetic environment for the antenna radiators.

In one exemplary embodiment, the antenna socket structure is a frame structure having an outer wall that surrounds and defines an inner region of the antenna socket. The planar antenna substrate is mounted to a first side of the antenna socket device such that the antenna is aligned to and faces the inner region of the antenna socket. The antenna socket may be formed of a metallic or non-metallic material. A second side of the antenna socket structure (opposite the first side) can be mounted to a metallic ground plane of a package frame (or a metallic lid) such that the inner region of the antenna socket structure is enclosed by the substrate and ground plane (or metallic lid) to form a closed cavity region.

In another exemplary embodiment, the antenna socket structure is a hollow metallic structure having an outer wall and planar surface that define an inner cavity region of the antenna socket. The antenna substrate is mounted to a first side of the antenna socket structure such that the antenna is aligned to and faces the inner cavity region of the antenna socket. The inner cavity region may be filled with a dielectric material or air.

In another exemplary embodiment of the invention, the integrated antenna device includes an antenna feed network formed thereon. In one embodiment, the feed network is printed on the antenna substrate and is coplanar with the printed antenna. In one exemplary embodiment where a metallic socket structure is employed, an aperture is formed in the outer wall of the antenna socket structure to allow passage of an antenna feed line of the feed network formed the substrate surface.

In yet another exemplary embodiment of the invention, the antenna socket structure is a dielectric substrate. The planar antenna substrate is mounted to a first side of the antenna socket structure such that the antenna is disposed between the substrate and the antenna socket structure. In another embodiment, the dielectric substrate of the antenna socket is coated with a layer of metallic material on all sides thereof except the first side.

These and other exemplary embodiments, aspects, features and advantages of the present invention will be described or become apparent from the following detailed description of exemplary embodiments, which is to be read in connection with the accompanying drawings.

DETAILED DESCRIPTION OF EXEMPLARY EMBODIMENTS

Figure 1:
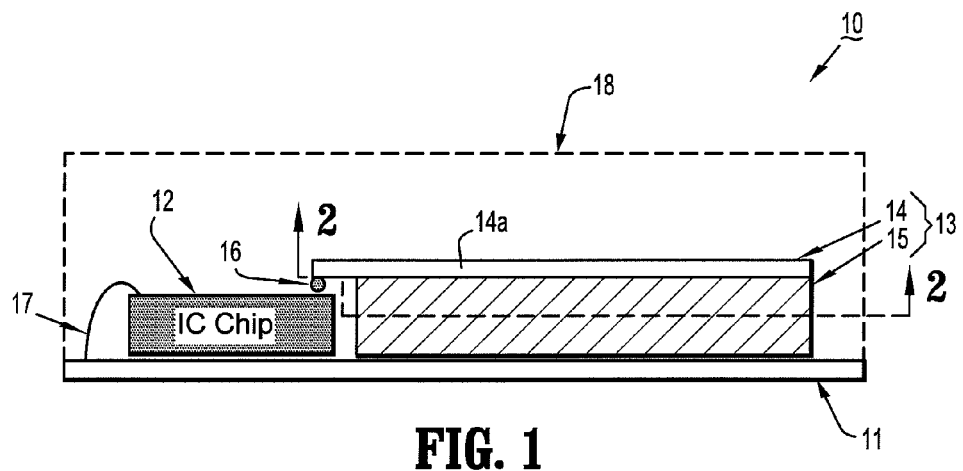
FIG. 1 schematically illustrates an apparatus for integrally packaging an IC chip with an integrated antenna module, according to an exemplary embodiment of the present invention.

FIG. 1 schematically illustrates an apparatus for integrally packaging an antenna and IC chip, according to an exemplary embodiment of the present invention. In general, FIG. 1 illustrates an electronic package apparatus (10) comprising a package frame structure (11), an integrated circuit chip (12) backside mounted to the package frame (11), an integrated antenna module (13) mounted to the package frame (11). The package frame can be one of various types of package structures including, but not limited to, package cores, substrates, carriers, die paddles, lead frames, etc., and other package structures that provide functions such as mechanical stability, chip mounting, electrical interface, etc.

The antenna module (13) comprises an integrated antenna device (14) mounted to an antenna socket structure (15). The integrated antenna device (14) comprises a planar substrate (14a) mounted to the socket structure (15), which has one or more antenna elements and antenna feeds, for example, printed or otherwise formed on a surface (bottom surface) of the planar substrate (14a).

As further depicted in FIG. 1, a portion of the integrated antenna device (14) extends past a side edge of the socket structure (15) and is disposed above the active surface of the chip (12). A solder ball connector (16) provides an electrical connection between a contact I/O pad on the active surface of the chip (12) and an antenna feed structure formed on the integrated antenna device (14), for example. The apparatus (10) further comprises wire bonds (17) that provide electrical connections (for I/O signals and power) between bond pads on the active surface of the IC chip (12) and appropriate connectors/pads/leads of the package frame (11). The package (10) includes a package mold (18) (or package encapsulation), which can be formed using known plastic materials for forming the package encapsulation layer (18).

Figure 2:
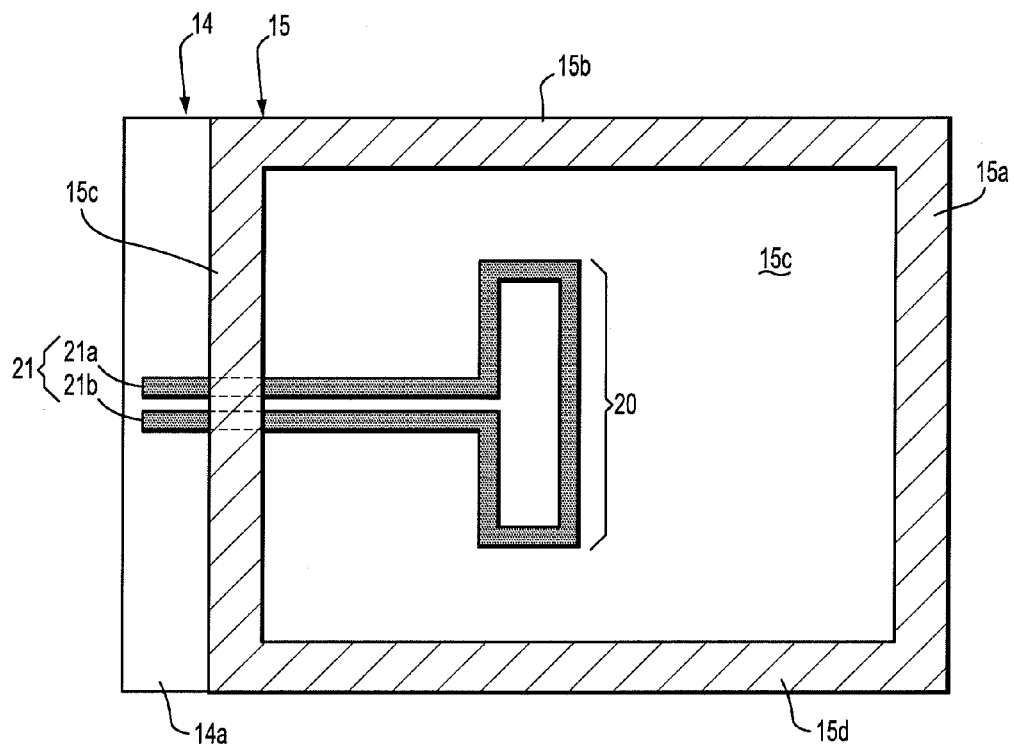
FIG. 2 schematically illustrates an integrated antenna module according to an exemplary embodiment of the invention.

In general, the socket structure (15) is designed to shield the antenna radiators from the surrounding materials and components of the package apparatus (10), thereby providing a closed EM environment allowing the antenna to be designed with a desired performance irrespective of the package structures and technologies. FIG. 2 schematically illustrates an exemplary embodiment of the integrated antenna module (13) of FIG. 1. In particular, FIG. 2 is a schematic plan view of the antenna module (13) from a viewpoint along line 2-2 in FIG. 1 in the direction of the arrows (i.e., in the exemplary embodiment, viewing the bottom surface of the substrate (14a) of the antenna device (14)). In the exemplary embodiment of FIG. 2, the integrated antenna device (14) comprises a printed folded dipole antenna (20) and antenna feed (21) formed on a surface of the planar substrate (14a). The antenna feed (21) is a balanced differential feed comprising differential feed lines (21a, 21b).

Further, in the exemplary embodiment of FIG. 2, the socket structure (15) comprises a rectangular structure with outer walls (15a, 15b, 15c, and 15d) that surround and define an inner region (15e). The antenna substrate (14a) is mounted (via suitable bonding material) to the socket (15) such that the printed antenna structure (20) is aligned to and faces the inner region (15d). The differential line (21) extends along the surface of the substrate 14a and passes through a small aperture or opening in the outer socket wall (15c) to enable electrical connection of the feed line to contacts on the surface of the chip (12) via the bonding balls (16) (FIG. 1). The socket structure (15) can have any suitable framework including, for example, the exemplary socket structures that will be discussed in detail below with reference to FIGS. 4A~C, 5A~C, 6A~c and 7A~C.

For example, the antenna socket structure (15) can be a hollow metallic structure formed from metallic material (e.g., copper, aluminum) having outer walls (15a~15d) and a planar metallic (bottom) surface (see, e.g., FIGS. 4A~C, 5A~c, for example), wherein the metallic bottom surface is bonded to the package frame (11). With this framework, the socket structure (15) provides a defined cavity region having metallic sidewalls and bottom surface, wherein the bottom surface of the socket provides a reference ground or reflector for the antenna. With the antenna substrate (14*a*) mounted to the socket structure (15), the radiating elements of the antenna (20) are disposed within a predefined, closed EM environment and are shielded from the surrounding package material. Indeed, the socket structure (15) provides a natural barrier to prevent lossy encapsulant material from flowing into the enclosed cavity region between the printed antenna (20) and reference ground during an encapsulation process.

In other exemplary embodiments of the invention (e.g., FIGS. 6A~6C, 7A~7C), the socket structure (15) can be a metallic/dielectric frame structure comprising outer walls (15*a*-15*d*) with no planar bottom (ground) surface. With this structure, a metallic ground plane can be formed on (or integrally formed from) the package frame (11), whereby the antenna socket structure (15) is mounted to the package frame (11) such that the inner region (15*e*) is aligned to the metallic ground plane. As with an exemplary socket structure providing an integrally formed ground plane, the ground plane of the package frame (11) operates as an antenna reference ground or reflector to ensure that no energy is radiated into the board on which the package (10) is mounted. In all instances, the metallic ground plane effectively limits the antenna radiation to the upper hemisphere above the antenna and enables consistent antenna performance.

It is to be appreciated that the exemplary antenna module (13) constructed with the antenna (14) and socket structure (15) as depicted in FIGS. 1 and 2, provides a closed EM environment for the antenna radiators (20) and a substantial portion of the feed line (21), which allows the integrated antenna (14) to be independently designed for a given operating frequency and performance without having to consider the effects on antenna performance due to the package layout, materials and components. Indeed, in contrast to conventional packaging methods, exemplary antenna module structures according to the invention allow the antenna to be designed independently of the type of packaging technology that is implemented. In other words, an integrated antenna module with an integrated antenna can be designed for a given operating frequency and performance, and then used with different packaging technologies without performance degradation requiring redesign.

Moreover, to further reduce the effects on performance due to packaging materials, in the exemplary embodiment of FIGS. 1 and 2, the portion of the feed line (21) that is external to the socket structure (15) can be encapsulated in a low dielectric constant material (e.g., foam) to protect the feed line from being covered by lossy encapsulant material during encapsulation. A low dielectric foam will have a relatively small influence on the impedance match. In this regard, the antenna feed lines can be fully protected and encapsulated further decoupling the antenna performance from packaging considerations.

It is to be further appreciated that exemplary antenna modules with closed cavity regions, controlled EM environments and reference ground planes, render antenna performance less sensitive to the ground size and surrounding dielectric material. For instance, a controlled air space provides better bandwidth and radiation efficiency for the antenna. In comparison to conventional antenna designs with floating ground planes of a same size, a closed cavity region reduces unwanted back-side radiation.

It is to be understood that the exemplary package (10) and integrated antenna module (13) structures of FIGS. 1 and 2 are merely exemplary embodiments, and that antenna modules and package structures can be designed with varying shapes, structures, layouts, configurations, materials, etc., depending on the application and desired performance. For example, with regard to antenna modules, the socket structures can be constructed with different metallic or low loss dielectric materials and with varying shapes. For instance, socket structures can be square, rectangular, round or oval-shaped. The types of socket materials used and the size/structures of the closed cavity regions can be varied to optimize various parameters (gain, match, efficiency and pattern. The cavity regions of hollow socket structures can be filled with air, or low-loss and low dielectric materials (e.g., foam).

In another exemplary embodiment of the invention, a socket structure may include a metallic bottom lid or plate that is shared between the chip and the socket frame. In this regard, the antenna does not require a package or board-level ground. This structure also improves stiffness of the assembly and allows more flexible boards or packages to be used.

Moreover, in the exemplary embodiments of FIGS. 1 and 2, the antenna (14) can be constructed with any suitable substrate material or antenna structure for a given application and desired performance. For example, the antenna substrate may be formed of, e.g., fused silica ($SiO_2$), alumina, polystyrene, ceramic, Teflon based substrates, FR4, FFP, etc., or semiconductor materials such as silicon. Moreover, depending on the intended application and/or frequency of operation, the antenna may comprise one or more of any suitable type of planar antennas, such as dipole antennas, a folded dipole antennas, ring antennas, rectangular loop antennas, patch antennas, coplanar patch antennas, monopole antennas, Yagi antennas, resonator antennas, antenna arrays, etc.

Furthermore, various types of IC chips may be integrally packaged with one or more antenna modules to construct electronic devices having highly-integrated, compact radio communications systems. For instance, an IC chip comprising an integrated transceiver circuit, an integrated receiver circuit, an integrated transmitter circuit, and/or other support circuitry, etc., can be packaged with one or more antenna modules to provide compact radio communications chips. These radio communications chips can be installed in various types of devices for wireless communication applications.

In other exemplary embodiments, various types of antenna feed networks and/or impedance matching networks, such as balanced differential lines, coplanar lines, etc., can be integrally formed on the antenna substrate (14*a*). For example, an impedance matching network (e.g., a transmission line) may be integrally formed on the antenna substrate (14*a*) to provide the necessary inductive/capacitive impedance matching between a device/component (e.g., power amplifier, LNA, etc.) formed on the IC chip and the printed antenna structure. Moreover, various types of feed networks may be implemented depending on, e.g., the impedance that is desired for the given application and/or the type of devices to which the antenna may be connected. For example, if the antenna is connected to an integrated transmitter system, the feed network will be designed to provide the proper connections and impedance matching for, e.g., a power amplifier. By way of further example, if the antenna is connected to a receiver system, the feed network may be designed to provide the proper connections and impedance matching for, e.g., an LNA (low noise amplifier). Various types of antenna feeds and/or impedance matching networks, such as balanced differential lines, coplanar lines, etc, may be implemented. It is to be understood that planar antennas, antenna feeds, transmission lines, vias, etc can be formed on the antenna substrate (14a) using standard methods known to those of ordinary skill in the art.

In the exemplary embodiment of FIG. 1, radiation (open) window can be formed in the encapsulation (18) above the antenna (14) either after or during the encapsulation process, to allow energy to radiate from the antenna (14) out of the package (10) without being attenuated by propagating through lossy encapsulation material.

Moreover, although FIG. 1 depicts a flip-chip ball bond connection between the chip (12) and antenna (14), other interconnect technologies such as wire bonding can be used to make electrical connections between the contacts of the chip (12) and antenna substrate (14a). In some applications, the use of wire bonding relaxes mechanical stress that may arise due to different material expansion coefficients of the chip (12) and the antenna (14).

Figure 3A:
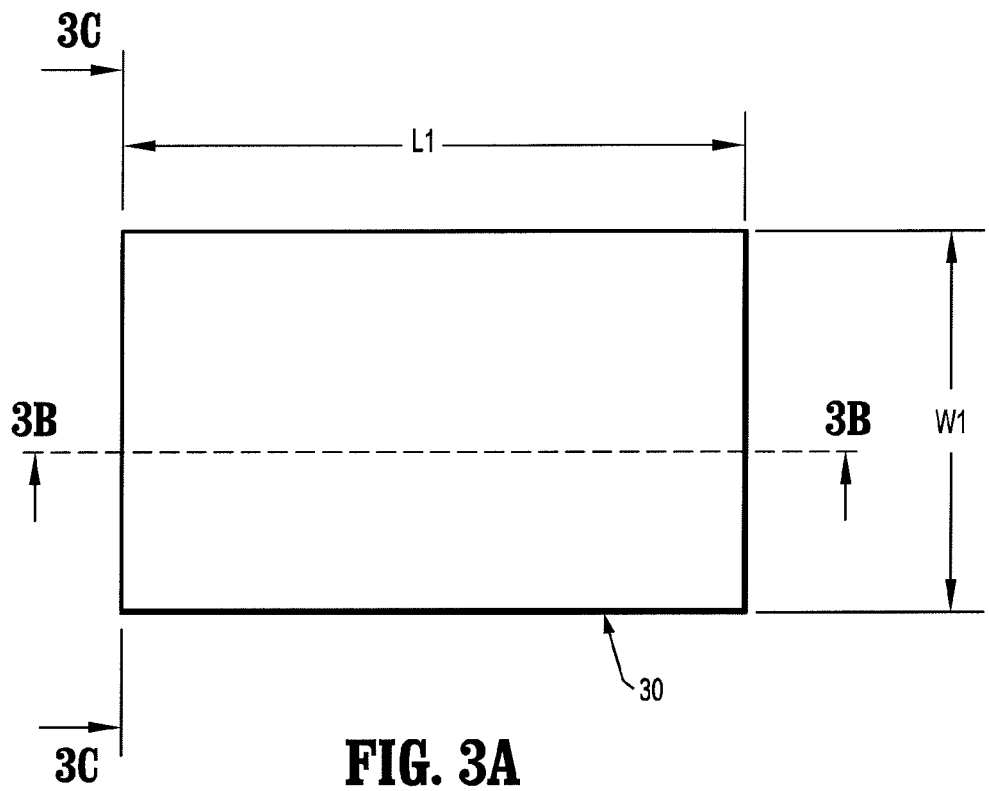
FIGS. 3A, 3B and 3C schematically illustrate an antenna socket structure according to an exemplary embodiment of the invention.
Figure 3B:
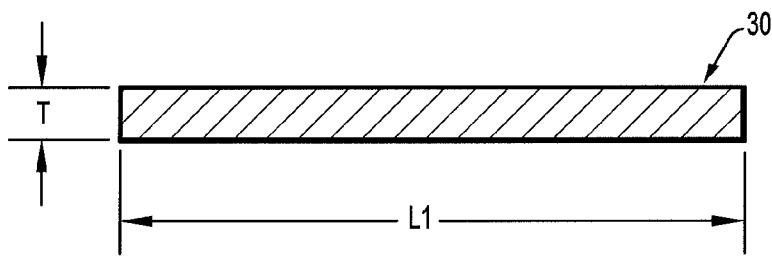
Figure 3C:
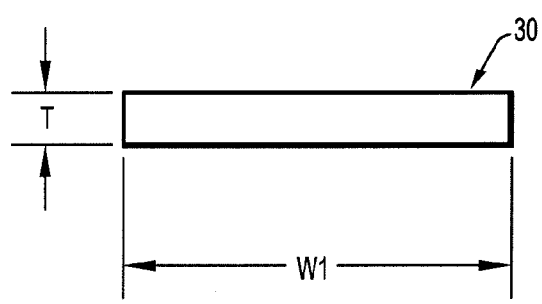

FIGS. 3A, 3B and 3C schematically illustrate an antenna socket structure according to an exemplary embodiment of the invention. In particular, FIG. 3A schematically illustrates a top plan view of an exemplary socket structure (30), FIG. 3B is a schematic cross-sectional view of the socket structure (30) along line 3B-3B in FIG. 3A, and FIG. 3C is a schematic cross-sectional view of the socket structure (30) along line 3C-3C in the direction of the arrow as depicted in FIG. 3A. The exemplary socket structure (30) is a rectangular-shaped, solid dielectric structure with a layout area L1×W1 and thickness T.

In one exemplary embodiment of the invention, the exemplary socket (30) is formed of a material that has a thermal expansion property that is similar to that of the antenna substrate. For example, the socket (30) can be formed of a covar alloy to match the thermal expansion of an antenna substrate formed of fused silica. If a solid frame is used, the frame material has to be of a low dielectric constant to work in this configuration, e.g. radiation upwards).

A substrate having a printed antenna device on a surface thereof is mounted to one surface of the socket (30) with the printed antenna sandwiched between the antenna substrate and socket (30). The module is then mounted on a package frame. When the package frame is formed of metal (e.g., copper, covar), the socket (30) can be bonded to a planar metallic surface of the frame structure, which metallic surface can operate as an antenna ground or reflector. With non-metallic package frames/substrates, a metallic ground plane can be formed on the frame and the socket (30) mounted on the metallic ground plane. As noted above, the ground plane can be shared with the chip for better stiffness. In another embodiment, the socket (30) can be formed such that the sidewalls and bottom surface of the dielectric socket (30) are coated with a layer of metallic material. In this structure, the antenna substrate is interfaced to the non-metallic coated surface of the dielectric socket (30), such that the dielectric is enclosed by the antenna substrate and the outer metallic shell coating on the sidewalls and bottom surface. A portion of the sidewall of the socket (30) that is adjacent the extending feed line on the surface of the antenna substrate will be devoid of metallic coating material so as to ensure that the metallic coating does not short the feed line or otherwise affect antenna performance.

Figure 4A:
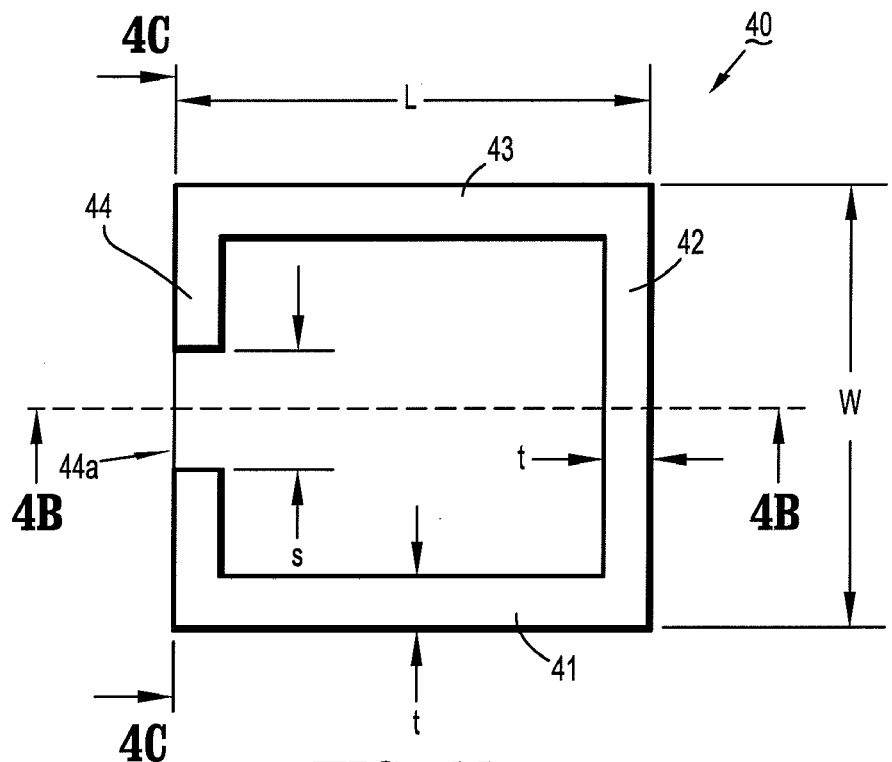
FIGS. 4A, 4B and 4C schematically illustrate an antenna socket structure according to another exemplary embodiment of the invention.
Figure 4B:
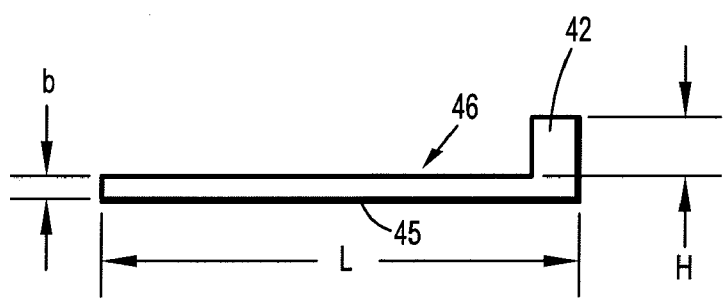
Figure 4C:
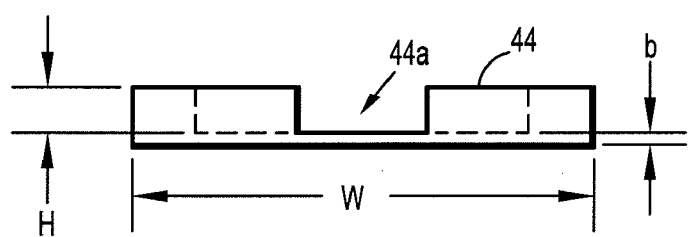

FIGS. 4A, 4B and 4C schematically illustrate an antenna socket structure according to an exemplary embodiment of the invention. In particular, FIG. 4A schematically illustrates a top plan view of an exemplary socket structure (40), FIG. 4B is a schematic cross-sectional view of the socket structure (40) along line 4B-4B in FIG. 4A, and FIG. 4C is a schematic cross-sectional view of the socket structure (40) along line 4C-4C in the direction of the arrow as depicted in FIG. 4A. The exemplary socket structure (40) is a rectangular-shaped, metallic structure which comprises outer walls (41, 42, 43 and 44) having a thickness t and a planar base element (45) having a thickness b, which define an inner cavity region (46) with a height H. The socket structure (40) has a layout area L×W. The outer wall (44) comprises an opening/aperture (44a) of length s and height H. The opening (44a) is formed to prevent shorting of an antenna feed line by the metallic socket wall. FPP foam, for example, can be used to encapsulate the portion of the feed line extending from the cavity region (46) and to plug the opening (44a) to prevent encapsulant from flowing under the antenna substrate thru the opening (44a) into the cavity region (46) of the socket structure (40) during encapsulation.

In the exemplary embodiment of FIGS. 4A~C, the planar base element (45) is used as a reference ground and/or reflector for an antenna mounted to the socket (40). The cavity region (46), which is defined by metallic surfaces, provides a controlled space that is not filled by lossy encapsulant. The cavity region (46) can be filled with air or low dielectric foam to provide desirable bandwidth and radiation efficiency for the antenna. The geometric shape, dimensions and/or fill materials of the cavity region (46) can be varied to optimize various parameters (gain, match, efficiency and pattern).

In the exemplary embodiment of FIGS. 4A~C, for a 60 GHz antenna operating frequency, the socket structure (40) can have the following dimensions: s=1 mm (0.1 mm tolerance acceptable), t=0.5 mm (0.1 mm tolerance acceptable), b=0.15-0.2 mm, H=0.5 mm, L=5 mm and W=3 mm. The socket (40) can be formed of copper or aluminum or cover, for example.

Figure 5A:
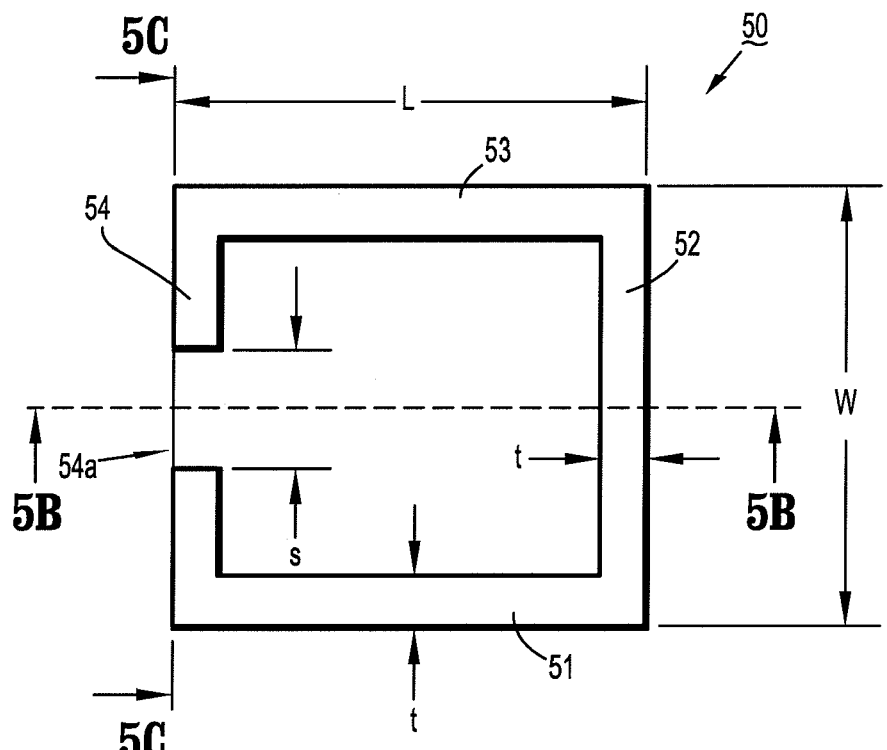
FIGS. 5A, 5B and 5C schematically illustrate an antenna socket structure according to another exemplary embodiment of the invention.
Figure 5B:
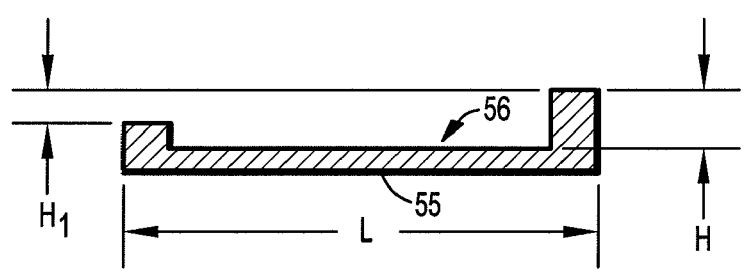
Figure 5C:
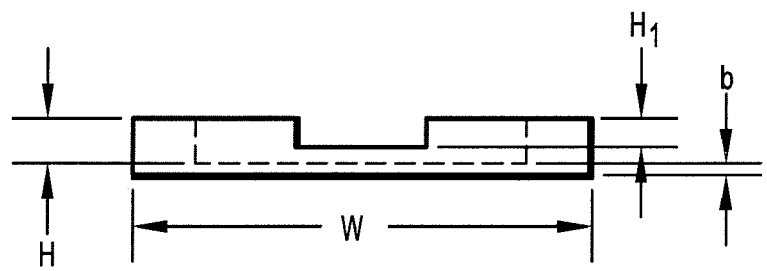

FIGS. 5A, 5B and 5C schematically illustrate an antenna socket structure according to an exemplary embodiment of the invention. In particular, FIG. 5A schematically illustrates a top plan view of an exemplary socket structure (50), FIG. 5B is a schematic cross-sectional view of the socket structure (50) along line 5B-5B in FIG. 5A, and FIG. 5C is a schematic cross-sectional view of the socket structure (50) along line 5C-5C in the direction of the arrow as depicted in FIG. 5A. The exemplary socket structure (50) is a rectangular-shaped, metallic structure which comprises outer walls (51, 52, 53 and 54) having a thickness t and a planar base element (55) having a thickness b, which define an inner cavity region (56) with a height H. The socket structure (50) has a layout area L×W. The outer wall (54) comprises an opening/aperture (54a) of length s and height H1. The opening (54a) is formed to prevent shorting of an antenna feed line by the metallic socket wall. FPP foam, for example, can be used to encapsulate the portion of the feed line extending from the cavity region (56) and to plug the opening (54a) to prevent encapsulant from flowing under the antenna substrate thru the opening (54a) into the cavity region (36) of the socket structure (50) during encapsulation.

The exemplary socket structure (50) is similar to the socket structure (40) discussed above with reference to FIGS. 4A~C, except that the opening (54a) is smaller, that is the height H1 of the opening (54a) is less than the height H of the opening (44a). The smaller opening more readily blocks or otherwise prevents encapsulation material from flowing inside of the frame.

Figure 6A:
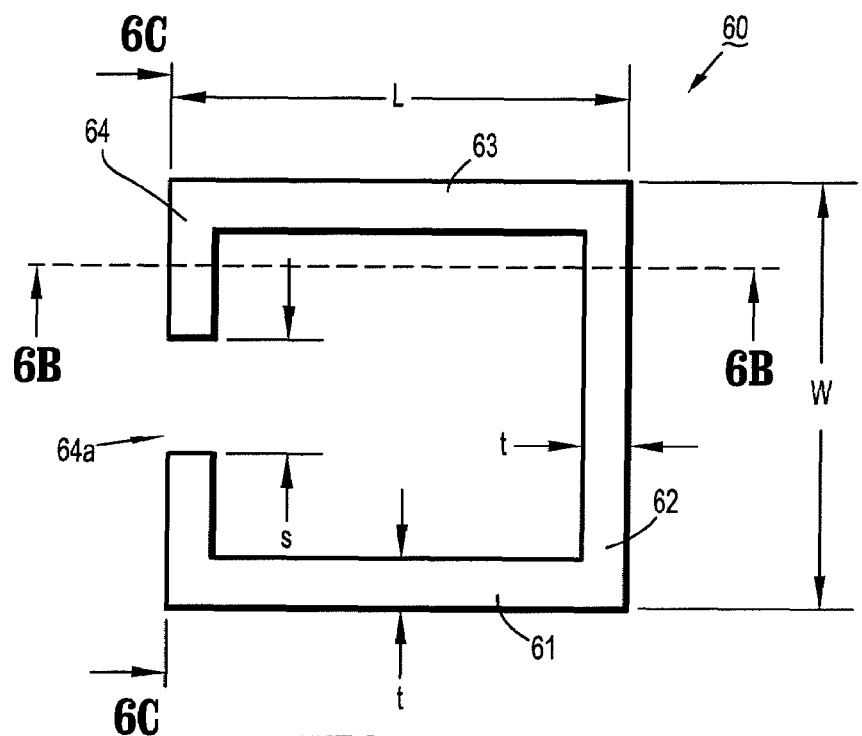
FIGS. 6A, 6B and 6C schematically illustrate an antenna socket structure according to another exemplary embodiment of the invention.
Figure 6B:
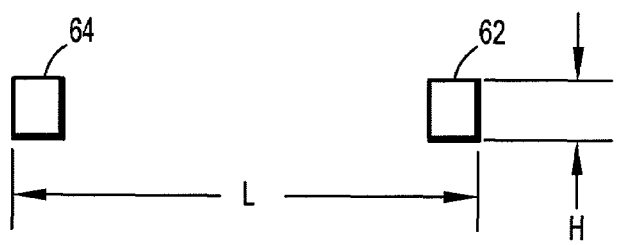
Figure 6C:
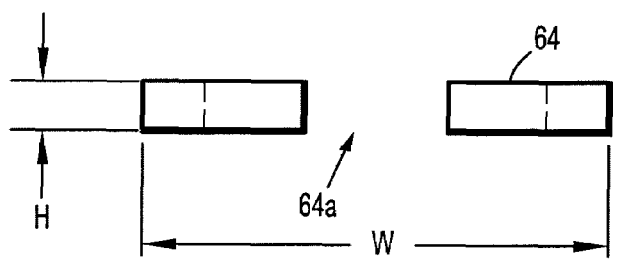

FIGS. 6A, 6B and 6C schematically illustrate an antenna socket structure according to an exemplary embodiment of the invention. In particular, FIG. 6A schematically illustrates a top plan view of an exemplary socket structure (60), FIG. 6B is a schematic cross-sectional view of the socket structure (60) along line 6B-6B in FIG. 6A, and FIG. 6C is a schematic cross-sectional view of the socket structure (60) along line 6C-6C in the direction of the arrow as depicted in FIG. 6A. The exemplary socket structure (60) is a rectangular-shaped, metallic structure which comprises outer walls (61, 62, 63 and 64) with thickness t and height H. The socket structure (60) has a layout area L×W. The outer wall (64) comprises an opening/aperture (64a) of length S and height H, which is formed to prevent shorting of an antenna feed line by the metallic socket wall.

The exemplary socket structure (60) is similar to the exemplary socket structure (30) of FIGS. 3A~C, except that the socket structure (60) does not have a planar base element. Moreover, the exemplary socket structure (60) can be formed from metallic or plastic/dielectric material. The socket structure (60) can be mounted to package frame wherein the frame surface and inner socket walls (61~64) define a cavity region that provides a controlled EM environment for an antenna mounted to the socket (60). When the package frame is formed of metal (e.g., copper), the socket (60) can be bonded to a planar metallic surface of the frame structure, which metallic surface can operate as an antenna ground or reflector. With non-metallic package frames/substrates, a metallic ground plane can be formed on the frame and the socket (60) mounted on the metallic ground plane. FPP foam can be used to encapsulate the portion of the feed line extending from the cavity region the opening (64a) to prevent encapsulant from flowing under the antenna substrate thru the opening (64a) into the cavity region of the socket structure (60) during encapsulation.

Figure 7A:
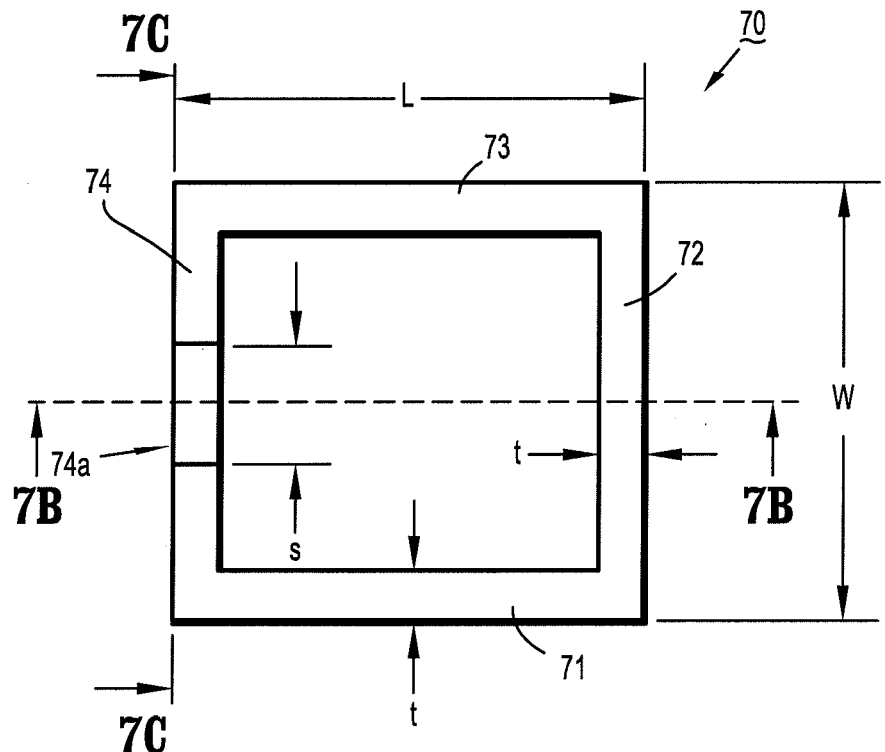
FIGS. 7A, 7B and 7C schematically illustrate an antenna socket structure according to another exemplary embodiment of the invention.
Figure 7B:
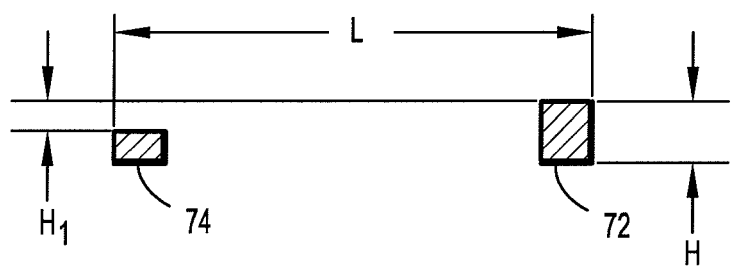
Figure 7C:
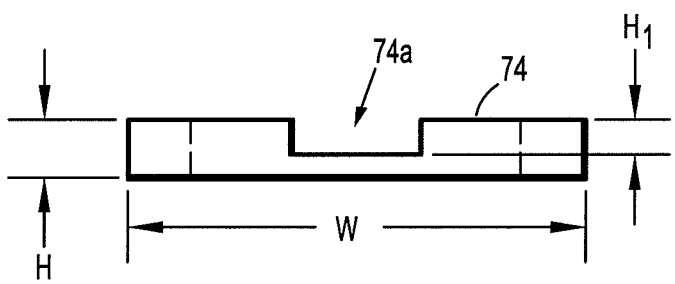

FIGS. 7A, 7B and 7C schematically illustrate an antenna socket structure according to an exemplary embodiment of the invention. In particular, FIG. 7A schematically illustrates a top plan view of an exemplary socket structure (70), FIG. 7B is a schematic cross-sectional view of the socket structure (70) along line 7B-7B in FIG. 7A, and FIG. 7C is a schematic cross-sectional view of the socket structure (70) along line 7C-7C in the direction of the arrow as depicted in FIG. 7A. The exemplary socket structure (70) is a rectangular-shaped structure which comprises outer walls (71, 72, 73 and 74) with thickness t and height H. The socket structure (70) has a layout area L×W. The outer wall (74) comprises an opening/aperture (74a) of length s and height H1, which is formed to prevent shorting of an antenna feed line by the metallic socket wall.

The exemplary socket structure (70) is similar to the socket structure (60) discussed above with reference to FIGS. 6A~C, except that the opening (74a) is smaller, that is the height H1 of the opening (74a) is less than the height H of the opening (64a).

In the exemplary embodiments discussed above, if the antenna substrate is a multi-layer design, the openings in the socket frames may not be required. By way of example, an integrated antenna device may comprise a multilayer antenna substrate, with at least two metallization layers with an inner metallic layer interposed between dielectric layers. In this regard, an antenna structure can be patterned from a bottom metal layer of the substrate, and a feed line can be patterned from the inner metal layer. Via contacts could be formed through a dielectric layer of the antenna substrate to provide electrical connections between the antenna and feed line, and between the feed line and contacts on the chip. With this embodiment, the portion of the antenna feed line that extends along the substrate past the sidewall of the socket structure is embedded within dielectric layers of the antenna substrate and thus protected from metallic portions of the socket structures.

Figure 8:
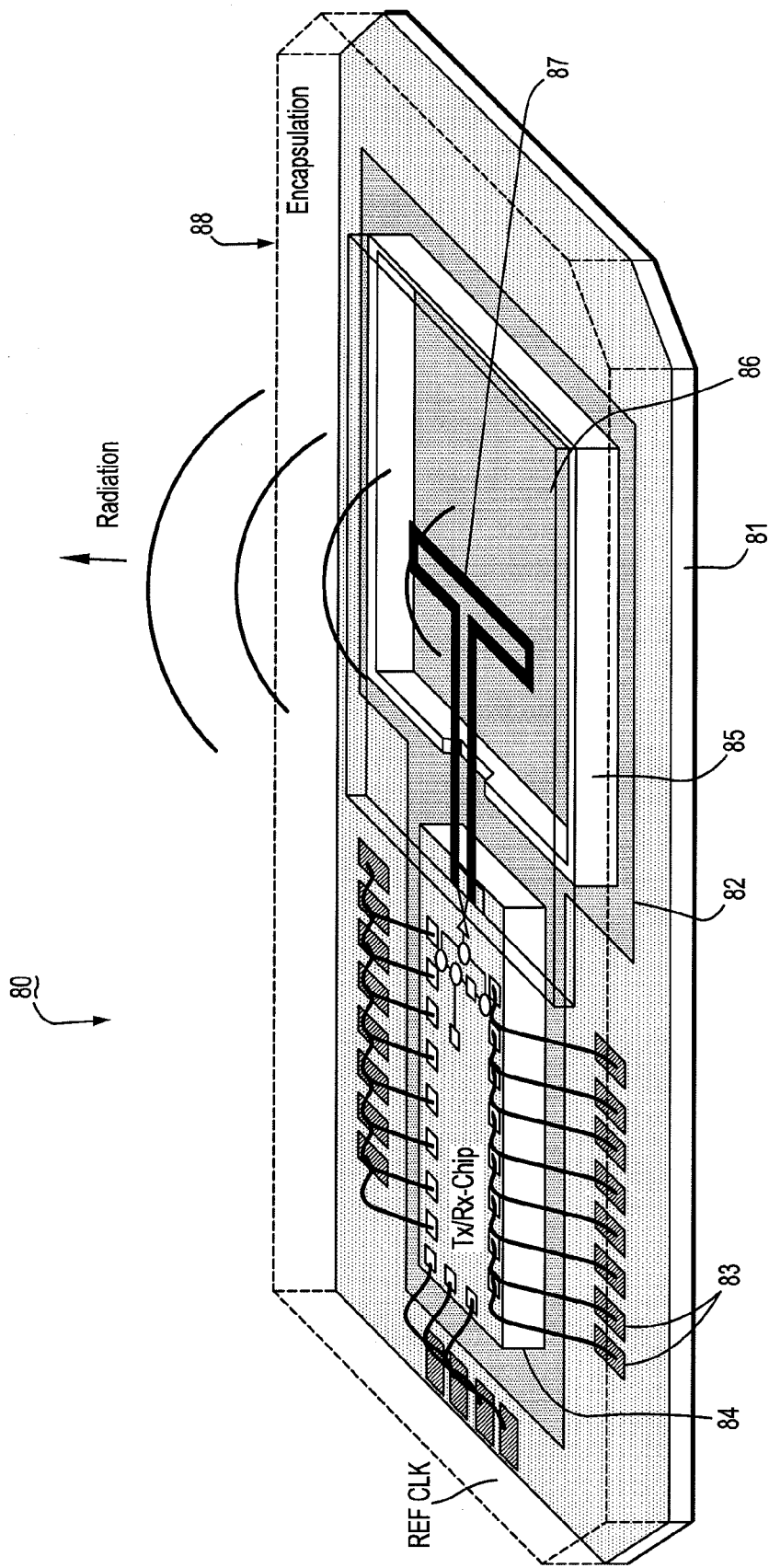
FIG. 8 is a perspective view of a chip-scale package with integrated antenna, according to an exemplary embodiment of the invention.

FIG. 8 is a perspective view of a chip-scale package with integrated antenna, according to an exemplary embodiment of the invention. FIG. 8 schematically illustrates an LGA (land grid array) package (80) comprising a package base (81) having a metallic base plate (82) and package pins (83), a chipset (84) (e.g., Tx and Rx chipset) and socket structure (85) mounted to the metallic base plate (82), an antenna device comprising an antenna substrate (86) and printed antenna (87), and an encapsulation layer (88) (shown in phantom). In one exemplary embodiment of the invention, the antenna is constructed from a fused silica (SiO2) substrate (which is transparent), and the socket structure (85) is a metal frame formed of a covar alloy having a thermal expansion characteristic similar to that of the fused silica antenna substrate (86). The antenna substrate ((86) can be bonded to the socket (85) using a thermosetting adhesive. The antenna device is flipped to the chip (84) using a thermal compression flip-chip bonding process, for example, while the socket (85) is attached to the metallic plate (82) of the package base (81) using a silver-filled adhesive, for example. In this manner, the printed antenna (87) is suspended in air below the antenna substrate (86) and the metallic base plate (82) acts as a reflecting ground. As noted above, the socket (85) provides mechanical support for the antenna and provided a well-controlled EM environment, thus making the antenna performance less sensitive to the surrounding package and PCB-level dielectric and metal layers.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. An electronic package apparatus, comprising:
   a package frame;
   an IC (integrated circuit) chip mounted to the package frame;
   an antenna socket device mounted to the package frame;
   a substrate having an antenna formed on a first surface of the substrate, wherein the substrate is mounted to the antenna socket device; and
   a package mold,
   wherein the substrate mounted to the antenna socket device provides a closed EM (electromagnetic) environment for the antenna such that antenna performance is not affected by package materials or components.

2. The apparatus of claim 1, wherein the antenna socket device is a frame structure comprising an outer wall that surrounds and defines an inner region of the antenna socket, wherein the first surface of the substrate is mounted to a first side of the antenna socket device such that the antenna is aligned to and faces the inner region of the antenna socket.

3. The apparatus of claim 2, wherein a second side of the antenna socket device is mounted to a metallic ground plane of the package frame, wherein the inner region of the antenna socket is enclosed by the substrate and ground plane to form a closed cavity region.

4. The apparatus of claim 3, wherein the antenna socket device is formed of a non-metallic material.

5. The apparatus of claim 3, wherein the antenna socket device is formed of a metallic material.

6. The apparatus of claim 5, wherein an aperture is formed in the outer wall of the antenna socket device to allow passage of an antenna feed line formed on the first surface of the substrate.

7. The apparatus of claim 1, wherein the antenna socket device is a hollow metallic structure comprising an outer wall and planar surface that define an inner cavity region of the antenna socket, wherein the first surface of the substrate is mounted to a first side of the antenna socket device such that the antenna is aligned to and faces the inner cavity region of the antenna socket.

8. The apparatus of claim 7, wherein the inner cavity region is filled with a dielectric material.

9. The apparatus of claim 7, wherein the inner cavity region is filled with air.

10. The apparatus of claim 1, wherein the antenna socket device is a dielectric substrate, wherein the first surface of the substrate is mounted to a first side of the antenna socket device such that the antenna is disposed between the substrate and the antenna socket device.

11. The apparatus of claim 10, wherein the dielectric substrate of the antenna socket device is coated with a layer of metallic material on all sides thereof except the first side.

12. The apparatus of claim 1, further comprising an antenna feed network formed on the first surface of the substrate, wherein the substrate mounted to the antenna socket device provides a closed EM (electromagnetic) environment for at least a portion of the antenna feed network.

13. The apparatus of claim 1, wherein the package mold includes an open window region that is formed over at least a portion of the substrate.

14. A modular antenna device for constructing electronic chip packages, comprising:
an antenna socket device; and
an integrated antenna device comprising a substrate and an antenna formed on a surface of the substrate;
wherein the substrate can be mounted to the antenna socket device to form an integrated antenna module that shields the antenna and provides a closed EM (electromagnetic) environment for the antenna,
wherein the antenna socket device is a frame structure comprising an outer wall that surrounds and defines an inner region of the antenna socket, wherein the first surface of the substrate is mounted to a first side of the antenna socket device such that the antenna is aligned to and faces the inner region of the antenna socket, and
wherein the antenna socket device is formed of a non-metallic material.

15. A modular antenna device for constructing electronic chip packages, comprising:
an antenna socket device; and
an integrated antenna device comprising a substrate and an antenna formed on a surface of the substrate;
wherein the substrate can be mounted to the antenna socket device to form an integrated antenna module that shields the antenna and provides a closed EM (electromagnetic) environment for the antenna,
wherein the antenna socket device is a frame structure comprising an outer wall that surrounds and defines an inner region of the antenna socket, wherein the first surface of the substrate is mounted to a first side of the antenna socket device such that the antenna is aligned to and faces the inner region of the antenna socket,
wherein the antenna socket device is formed of a metallic material, and
wherein an aperture is formed in the outer wall of the antenna socket device to allow passage of an antenna feed line formed on the first surface of the substrate.

16. A modular antenna device for constructing electronic chip packages, comprising:
an antenna socket device; and
an integrated antenna device comprising a substrate and an antenna formed on a surface of the substrate;
Wherein the substrate can be mounted to the antenna socket device to form an integrated antenna module that shields the antenna and provides a closed EM (electromagnetic) environment for the antenna,
wherein the antenna socket device is a hollow metallic structure comprising an outer wall and planar surface that define an inner cavity region of the antenna socket, wherein the first surface of the substrate is mounted to a first side of the antenna socket device such that the antenna is aligned to and faces the inner cavity region of the antenna socket, and
wherein the inner cavity region is filled with a dielectric material.

17. A modular antenna device for constructing electronic chip packages, comprising:
antenna socket device; and
an integrated antenna device comprising a substrate and an antenna formed on a surface of the substrate;
wherein the substrate can be mounted to the antenna socket device to form an integrated antenna module that shields the antenna and provides a closed EM (electromagnetic) environment for the antenna, and
wherein the antenna socket device is a dielectric substrate, wherein the first surface of the substrate is mounted to a first side of the antenna socket device such that the antenna is disposed between the substrate and the antenna socket device.

* * * * *